(12) United States Patent
Nojiri et al.

(10) Patent No.: US 8,912,521 B2
(45) Date of Patent: Dec. 16, 2014

(54) NON-VOLATILE SEMICONDUCTOR MEMORY DEVICE

(71) Applicant: Kabushiki Kaisha Toshiba, Tokyo (JP)

(72) Inventors: Yasuhiro Nojiri, Yokohama (JP);
Hiroyuki Fukumizu, Yokohama (JP);
Shigeki Kobayashi, Kuwana (JP);
Masaki Yamato, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 94 days.

(21) Appl. No.: 13/845,935

(22) Filed: Mar. 18, 2013

(65) Prior Publication Data
US 2014/0138597 A1    May 22, 2014

Related U.S. Application Data (60) Provisional application No. 61/727,301, filed on Nov. 16, 2012.

(51) Int. Cl.
*H01L 29/02* (2006.01)
*H01L 27/24* (2006.01)
*H01L 45/00* (2006.01)

(52) U.S. Cl.
CPC ............ *H01L 45/16* (2013.01); *H01L 27/2454* (2013.01); *H01L 45/04* (2013.01); *H01L 45/149* (2013.01); *H01L 45/1226* (2013.01); *H01L 27/249* (2013.01); *H01L 45/146* (2013.01)
USPC ............................................. 257/2; 438/382

(58) Field of Classification Search
USPC ............................................. 257/2; 438/382
See application file for complete search history.

(56) References Cited

U.S. PATENT DOCUMENTS

| | | |
|---|---|---|
| 7,910,914 B2 | 3/2011 | Tanaka et al. |
| 8,120,006 B2 | 2/2012 | Kim et al. |
| 8,124,968 B2 | 2/2012 | Koo et al. |
| 8,299,571 B2 | 10/2012 | Ozawa et al. |
| 8,338,224 B2 | 12/2012 | Yoon et al. |
| 8,357,992 B2 | 1/2013 | Kim et al. |

FOREIGN PATENT DOCUMENTS

| | | |
|---|---|---|
| JP | 8-13166 | 1/1996 |
| JP | 2008-181978 | 8/2008 |
| JP | 2010-10688 | 1/2010 |
| JP | 2010-74169 | 4/2010 |
| JP | 2010-166047 | 7/2010 |
| JP | 2010-251479 | 11/2010 |
| JP | 2011-86918 | 4/2011 |
| JP | 2011-129639 | 6/2011 |

*Primary Examiner* — Marvin Payen
(74) *Attorney, Agent, or Firm* — Oblon, Spivak, McClelland, Maier & Neustadt, L.L.P.

(57) ABSTRACT

First conductive layers extend in a first direction horizontal to a substrate as a longitudinal direction, and are stacked in a direction perpendicular to a substrate. An interlayer insulating layer is provided between the first conductive layers. The variable resistance layers functioning as a variable resistance element are formed continuously on the side surfaces of the first conductive layers and the interlayer insulating layer. A columnar conductive layer is provided on the side surfaces of the first conductive layers and the interlayer insulating layer via the variable resistance layers. First side surfaces of the first conductive layers are recessed from a second side surface of the interlayer insulating layer in the direction away from the columnar conductive layers.

19 Claims, 10 Drawing Sheets

NON-VOLATILE SEMICONDUCTOR MEMORY DEVICE

CROSS REFERENCE TO RELATED APPLICATIONS

This application is based on and claims the benefit of priority from prior U.S. Provisional Patent Application No. 61/727,301, filed on Nov. 16, 2012, the entire contents of which are incorporated herein by reference.

FIELD

The embodiments described in the present specification relate to a non-volatile semiconductor memory device.

BACKGROUND

As recent semiconductor memory devices become more integrated, the associated LSI devices become increasingly more compact. The more compact LSI devices require not only a smaller line width, but improved dimensional and positional accuracies of circuit patterns. As a technology to overcome such a problem, a ReRAM (Resistive RAM) is proposed that uses, as a memory, a variable resistance element that reversibly changes the resistance. Then, it is believed that the memory cell array can become more highly integrated by a VAL (Vertical Array Line) structure in the ReRAM that includes the variable resistance element provided between the side walls of word-lines extending in parallel with a substrate and the side walls of bit-lines extending perpendicular to the substrate.

It is required in the VAL structure that thinned interlayer dielectric films are formed between a plurality of stacked word-lines to provide a more integrated memory cell array. However, thinned interlayer dielectric films may reduce the withstand voltage between the memory cells. In this way, it is required in the VAL structure that a more integrated memory cell array is provided while improving the withstand voltage between the memory cells.

DETAILED DESCRIPTION

Semiconductor memory devices according to the embodiments described below include a memory cell array, the memory cell array including a plurality of first wiring lines, and a plurality of second wiring lines, the first and second wiring lines crossing each other, and a plurality of memory cells, the memory cells being disposed in the crossing portions of the first and second wiring lines, each memory cell including a variable resistance element. The memory cell array includes a plurality of first conductive layers, the first conductive layers extending in a first direction horizontal to a substrate as the longitudinal direction, the first conductive layers being stacked in a direction perpendicular to the substrate, and the first conductive layers functioning as the first wiring lines. An interlayer insulating layer is provided between the first conductive layers. A variable resistance layer is formed continuously on the side surfaces of the first conductive layers and the interlayer insulating layer. The variable resistance layer functions as the variable resistance element. A columnar conductive layer is provided on the side surfaces of the first conductive layer and the interlayer insulating layer via the variable resistance layer. The columnar conductive layer extends in a direction perpendicular to the substrate as the longitudinal direction and function as the second wiring lines. First side surfaces of the first conductive layers are recessed from a second side surface of the interlayer insulating layer in the direction away from the columnar conductive layers. The variable resistance layers are formed continuously on the first and second side surfaces. The variable resistance layer has a convex shape on the second side surface.

In another aspect, the second side surface of the interlayer insulating layer is recessed from the first side surfaces of the first conductive layers in the direction away from the columnar conductive layers. Then, the variable resistance layer is formed continuously on the first and second side surfaces. The variable resistance layers have a convex shape on the first side surfaces.

Referring now to the accompanied drawings, the embodiments of the present invention will be described in more detail.

First Embodiment

Figure 1:
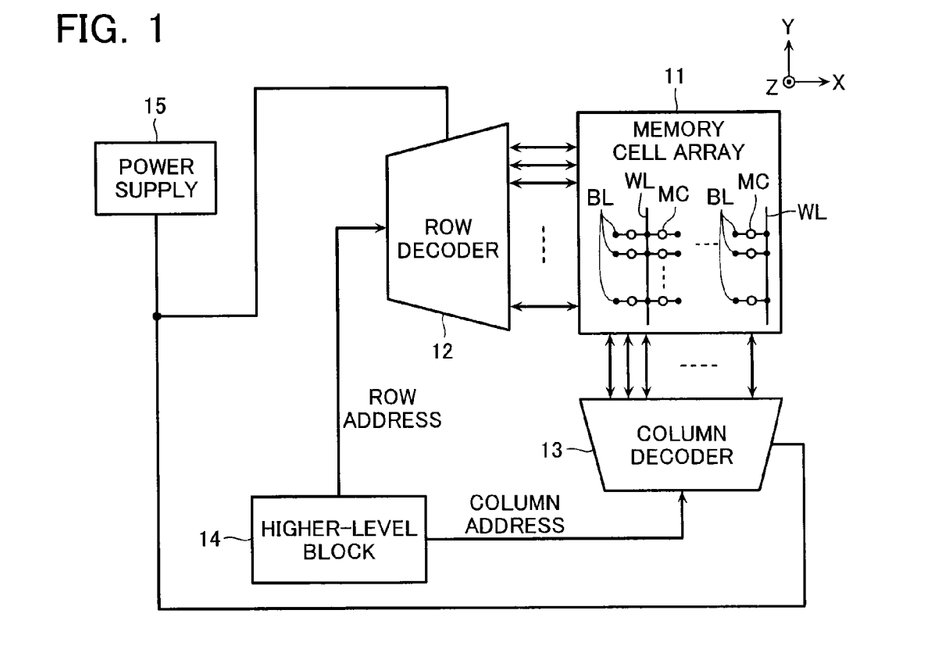
FIG. 1 is a block diagram of a semiconductor memory device according to a first embodiment.

With reference to FIGS. 1 to 5, the entire configuration of a semiconductor memory device according to a first embodiment will be described. FIG. 1 is a block diagram of a semiconductor memory device according to the first embodiment. With reference to FIG. 1, the semiconductor memory device includes a memory cell array 11, a row decoder 12, a column decoder 13, a higher-level block 14, and a power supply 15.

The memory cell array 11 includes a plurality of word-lines WL and a plurality of bit-lines BL, the word-lines WL and bit-lines BL crossing each other, and memory cells MC disposed in the crossing portions. The memory cells MC are arranged in a matrix in three-dimensional directions, as described below. As will be described in more detail later, the bit-lines BL extend in a direction (Z direction) perpendicular to the substrate, and are arranged in a matrix in directions (X and Y directions) horizontal to the substrate. The word-lines WL are arranged extending in the X direction as the longitudinal direction and are formed in the stacking direction (FIG. 1 simply shows a single layer word-line WL).

The row decoder 12 selects a word-line WL corresponding to a given row address when performing various operations such as an erase operation/a write operation/a read operation. The column decoder 13 selects a bit-line BL corresponding to a given column address for various operations.

The higher-level block 14 selects a memory cell MC to be accessed in the memory cell array 11. The higher-level block 14 provides a row address and a column address to the row decoder 12 and the column decoder 13, respectively. The power supply 15 generates a combination of predetermined voltages corresponding to various operations such as an erase operation/a write operation/a read operation, and supplies it to the row decoder 12 and the column decoder 13.

Figure 2:
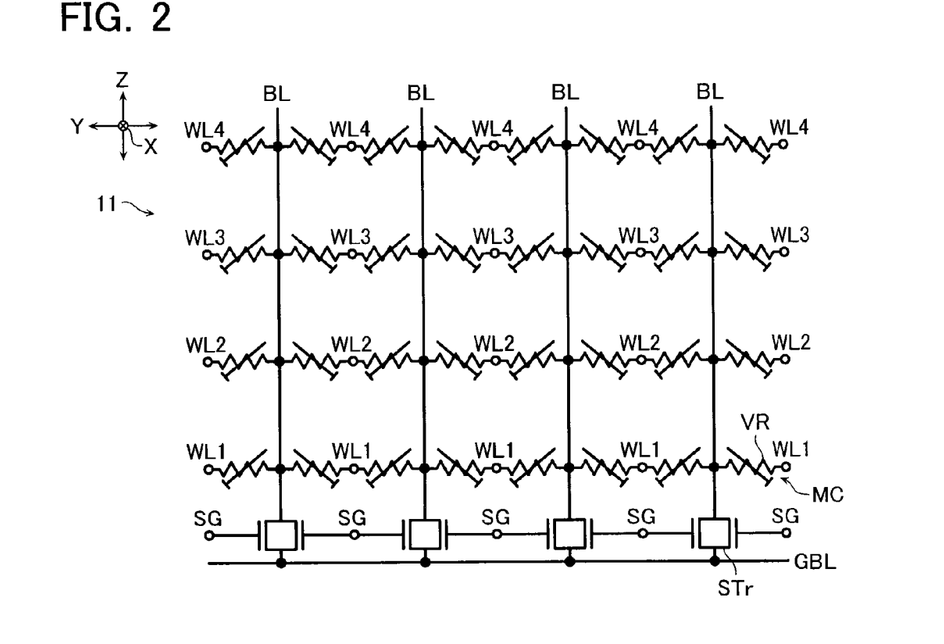
FIG. 2 is an equivalent circuit diagram describing in more detail a structure of a memory cell array 11 according to the first embodiment.

Referring now to FIG. 2, the memory cell array 11 according to the first embodiment will be described in more detail. FIG. 2 is a circuit diagram of the memory cell array 11. Note that in FIG. 2, the X direction, the Y direction, and the Z direction are perpendicular to each other, and the X direction is a direction perpendicular to the plane. In addition, the structure shown in FIG. 2 is provided repeatedly in the X direction.

With reference to FIG. 2, the memory cell array 11 includes, in addition to the above word-lines WL, the bit-lines BL, and the memory cells MC, a select transistor STr, a global bit-line GBL, and a select gate line SG.

With reference to FIG. 2, the word-lines WL1 to WL4 are stacked in the Z direction, and extend in the X direction as the longitudinal direction. The bit-lines BL extend in the Z direction as the longitudinal direction, and are arranged in a matrix in the X and Y directions (FIG. 2 only shows one-layer bit-lines BL in the X direction).

The memory cells MC are disposed in the crossing locations of the word-lines WL and bit-lines BL. The memory cells MC are thus arranged in a three-dimensional matrix in the X, Y, and Z directions.

With reference to FIG. 2, each memory cell MC includes a variable resistance element VR. The variable resistance element VR is electrically rewritable and stores data in a nonvolatile manner according to the resistance. The variable resistance element VR is set to a low resistance state (a set state) by a set operation that applies a certain amount of voltage or more across the element VR. The variable resistance element VR is set to a high resistance state (a reset state) by a reset operation that applies a certain amount of voltage or more across the element VR. Further, immediately after the manufacture, it is difficult to change the resistance state of the variable resistance element and the element is in a high resistance state. Thus, a forming operation is performed that applies a high voltage across the variable resistance element VR, the voltage being equal to or more than the voltages for the set and reset operations. The forming operation forms a region (a filament path) in the variable resistance element VR that locally and easily conducts a current. The variable resistance element VR may thus easily change its resistance state and become a state operatable as a memory element.

With reference to FIG. 2, the select transistor STr is provided between a first end of a bit-line BL and the global bit-line GBL. A plurality of global bit-lines GBL extend in the Y direction as the longitudinal direction, and are arranged at a predetermined pitch in the X direction. One global bit-line GBL is commonly connected to first ends of a plurality of select transistors STr aligned in the Y direction. The select gate line SG is formed extending in the X direction as the longitudinal direction. One select gate line SG is commonly connected to the gates of a plurality of select transistors STr aligned in the X direction.

Figure 3:
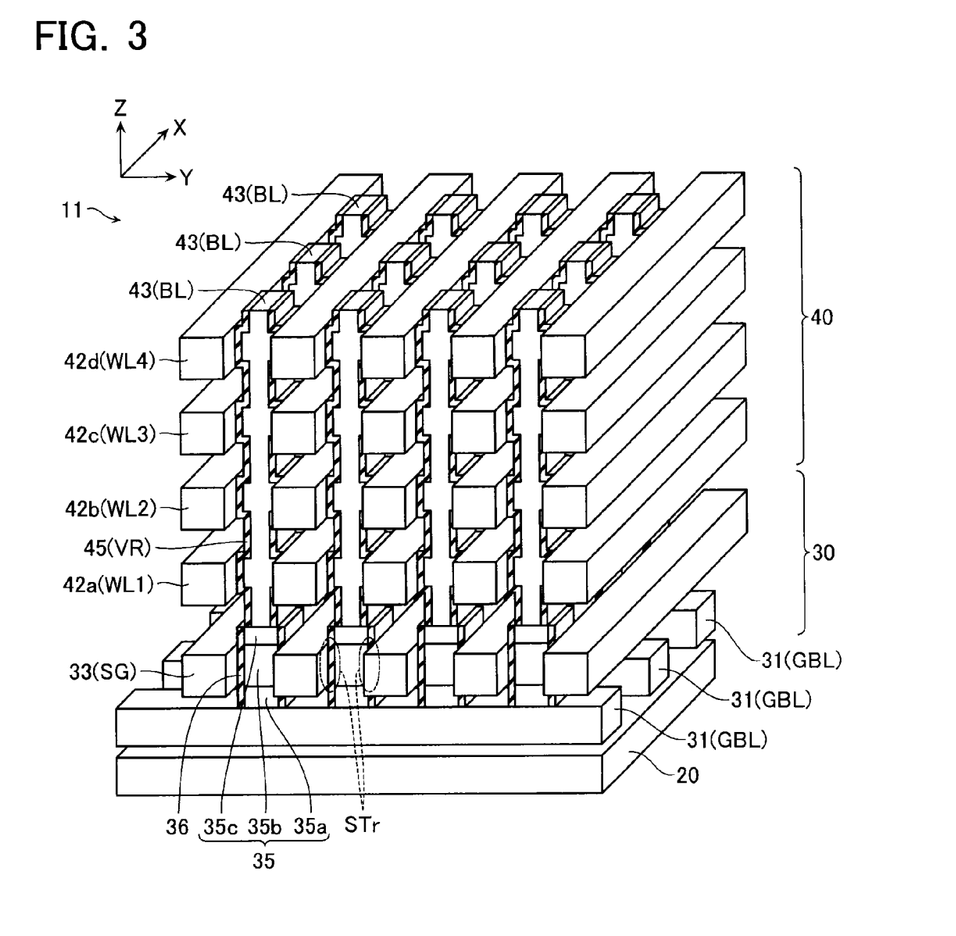
FIG. 3 is a schematic perspective view describing in more detail a structure of the memory cell array 11 according to the first embodiment.
Figure 4:
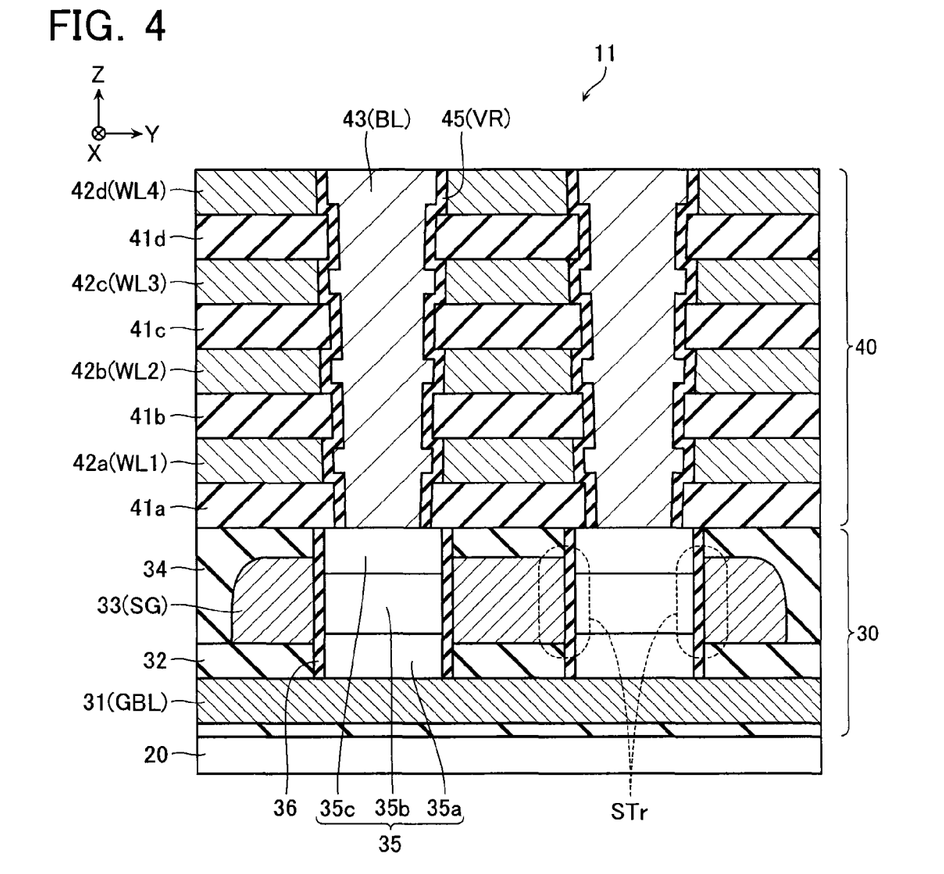
FIG. 4 is a cross-sectional view describing in more detail a structure of the memory cell array 11 according to the first embodiment.
Figure 5:
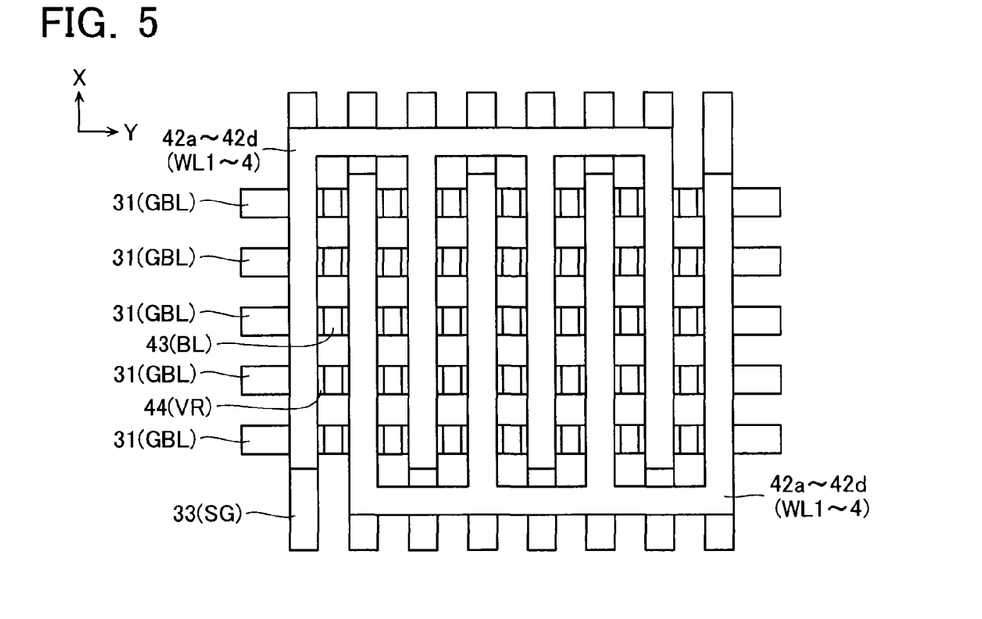
FIG. 5 is a plan view describing in more detail a structure of the memory cell array 11 according to the first embodiment.

Referring now to FIGS. 3 to 5, a stacked structure of the memory cell array 11 according to the embodiment will be described. FIG. 3 is a perspective view showing a stacked structure of the memory cell array 11. FIG. 4 is a cross-sectional view of FIG. 3. FIG. 5 is a top view of FIG. 3. Note that an interlayer insulating layer is omitted in FIGS. 3 and 5. FIG. 3 also shows simplified word-lines WL.

With reference to FIGS. 3 and 4, the memory cell array 11 includes a select transistor layer 30 and a memory layer 40. The select transistor layer 30 functions as the select transistors STr. The memory layer 40 functions as the memory cells MC.

With reference to FIGS. 3 and 4, the select transistor layer 30 includes a conductive layer 31, an interlayer insulating layer 32, a conductive layer 33, and an interlayer insulating layer 34. The conductive layer 31 functions as the global bit-line GBL. The conductive layer 33 functions as the gates of the select gate line SG and the select transistor STr.

A plurality of conductive layers 31 are formed extending in the Y direction horizontal to the substrate 20 as the longitudinal direction. The conductive layers 31 are also arranged at a predetermined pitch in the X direction parallel to the substrate 20. The interlayer insulating layer 32 is formed covering the upper surfaces of the conductive layers 31. A plurality of conductive layers 33 extend in the X direction as the longitudinal direction. The conductive layers 33 are also formed being arranged at a predetermined pitch in the Y direction.

The interlayer insulating layer 34 is formed covering side surfaces and the upper surfaces of the conductive layers 33. By way of example, the conductive layers 31 and 33 are made of polysilicon. The interlayer insulating layers 32 and 34 are made of silicon dioxide ($SiO_2$).

With reference to FIGS. 3 and 4, the select transistor layer 30 also includes columnar semiconductor layers 35 and gate insulating layers 36. The columnar semiconductor layers 35 function as the bodies (a channels) of the select transistors STr. The gate insulating layers 36 function as the gate-insulating films of the select transistors STr.

The columnar semiconductor layers 35 are disposed in a matrix in the X and Y directions, and extend in a columnar shape in the Z direction. The columnar semiconductor layers are also in contact with the upper surfaces of the conductive layers 31, and in contact with side surfaces of Y direction end portions of the conductive layers 33 via the gate insulating layers 36. Then, each columnar semiconductor layer 35 includes a stack of an N+ type semiconductor layer 35a, a P+ type semiconductor layer 35b, and an N+ type semiconductor layer 35c.

With reference to FIGS. 3 and 4, the N+ type semiconductor layer 35a is contact, on a side surface of its Y direction end portion, with the interlayer insulating layer 32. The P+ type semiconductor layer 35b is in contact, on a side surface of its Y direction end portion, with a side surface of the conductive layer 33. The N+ type semiconductor layer 35c is in contact, on a side surface of its Y direction end portion, with the interlayer insulating layer 34. The N+ type semiconductor layers 35a and 35c are made of N+ type impurity-implanted polysilicon. The P+ type semiconductor layer 35b is made of P+ type impurity-implanted polysilicon. The gate insulating layers 36 are made of, for example, silicon dioxide ($SiO_2$).

With reference to FIGS. 3 and 4, the memory layer 40 includes an alternating stack in the Z direction of interlayer insulating layers 41a to 41d and conductive layers 42a to 42d. The conductive layers 42a to 42d function as the word-lines WL1 to WL4, respectively.

With reference to FIG. 5, each of the conductive layers 42a to 42d includes a pair of comb shapes opposite in the X direction. The interlayer insulating layers 41a to 41d are made of, for example, silicon dioxide ($SiO_2$). The conductive layers 42a to 42d are made of, for example, a metal material such as titanium nitride (TiN) or polysilicon.

With reference to FIGS. 3 and 4, the memory layer 40 also includes columnar conductive layers 43 and variable resistance films 45. The columnar conductive layers 43 are made of, for example, polysilicon. Each variable resistance film 45 may be, for example, a film including, as a main component, an oxide including at least one element selected from the group consisting of hafnium (Hf), zirconium (Zr), nickel (Ni), tantalum (Ta), tungsten (W), cobalt (Co), aluminum (Al), iron (Fe), mangan (Mn), chromium (Cr), and niobium (Nb). Specifically, each variable resistance film 45 may be made of a thin film including one of $HfO_2$, $Al_2O_3$, $TiO_2$, NiO, $WO_3$, and $Ta_2O_5$. However, the variable resistance films 45 are not limited to the above materials, and may be changed to any other films that may change in resistance when applied with a voltage or the like. For example, carbon (C) or the like may be used as the material of the variable resistance films 45. Note that about a few nm is sufficient for the film thickness of each variable resistance film 45.

The columnar conductive layers 43 are disposed in a matrix in the X and Y directions. The columnar conductive layers 43 are in contact with the upper surfaces of the columnar semiconductor layers 35. The columnar conductive layers 43 extend in the Z direction as the longitudinal direction. The columnar conductive layers 43 function as the above bit-lines BL.

With reference to FIG. 4, in this embodiment, the Y-direction side surfaces of the conductive layers 42a to 42d are formed being recessed from the Y-direction side surfaces of the interlayer dielectric films 41a to 41d in the direction away from the columnar conductive layers 43. Thus, the columnar semiconductor layers 43 have a larger width at the conductive layers 42a to 42d portions than at the interlayer dielectric film 41a to 41d portions (in other words, the columnar semiconductor layers 43 have projections at the portions opposite to the conductive layers 42a to 42d). In this embodiment, the above structure may improve the withstand voltage between the memory cells MC. Note that the distance Dy between the Y-direction side surfaces of the conductive layers 42a to 42d and the Y-direction side surfaces of the interlayer dielectric films 41a to 41d is, by way of example, about 5 nm. Further, the distance Dy is preferably less than a half of the thickness Tz of the conductive layer 42a.

[Manufacturing Method]

Referring now to FIGS. 6 to 12, a method for manufacturing a semiconductor memory device according to the first embodiment will be described. A method for manufacturing the select transistor layer 30 is omitted here, and a method for manufacturing the memory layer 40 will be described. It is apparent to those skilled in the art from the shape of the select transistor layer 30 that the layer 30 may be manufactured by a combination of processes such as well-known photolithography, reactive ion etching (RIE), and chemical vapor deposition (CVD).

Figure 6:
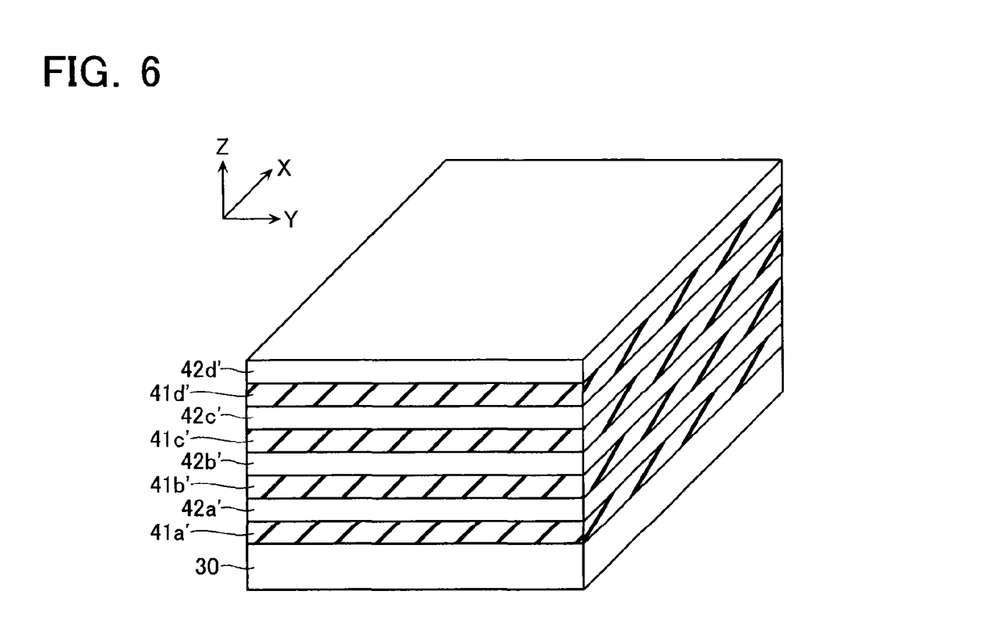
FIG. 6 is a process chart of a process for manufacturing a semiconductor memory device according to the first embodiment.

After the select transistor layer 30 is formed, silicon dioxide ($SiO_2$) and polysilicon (Si) are alternately deposited on the upper surface of the select transistor layer 30. This forms interlayer insulating layers 41a' to 41d' and conductive layers 42a' to 42d' as a plate extending in the X and Y directions.

Figure 7:
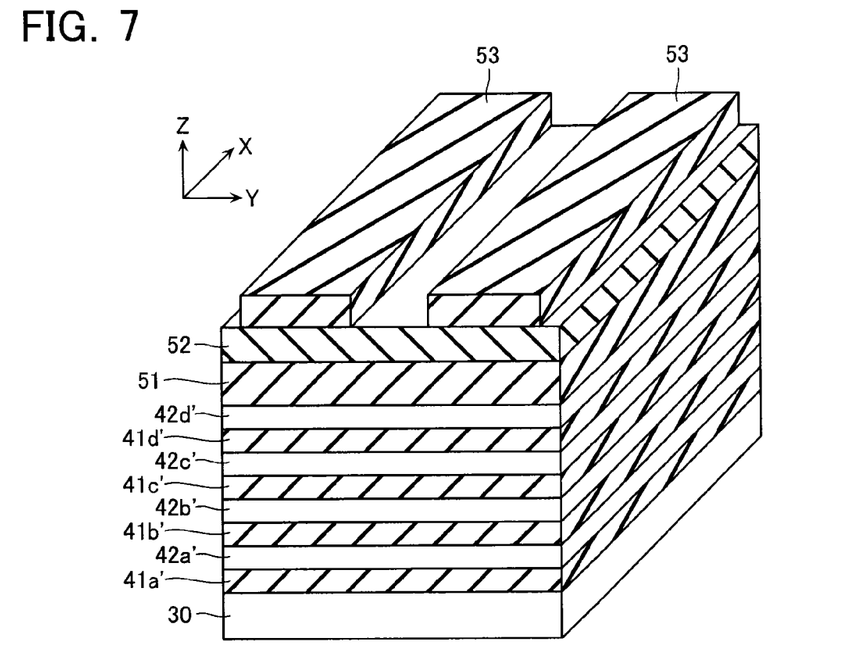
FIG. 7 is a process chart of a process for manufacturing a semiconductor memory device according to the first embodiment.

Then, with reference to FIG. 7, insulating layers 51 and 52 are deposited on the conductive layer 42d'. Then, an etching mask 53 is deposited on the upper surface of the insulating layer 52. The etching mask 53 is formed using a photo-etching process and the reactive ion etching. The etching mask 53 includes patterns that are arranged at a predetermined pitch in the Y direction and extend in the X direction as the longitudinal direction.

Figure 8:
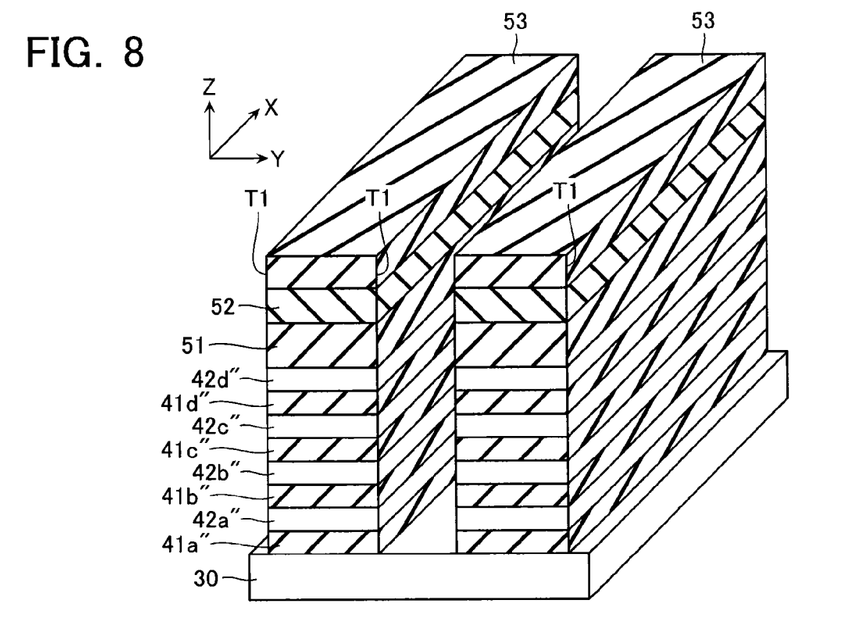
FIG. 8 is a process chart of a process for manufacturing a semiconductor memory device according to the first embodiment.

Then, with reference to FIG. 8, the interlayer insulating layers 41a' to 41d' and the conductive layers 42a' to 42d' are etched using the etching mask 53 as a mask, thus forming a trench T1. The trench T1 passes through the interlayer insulating layers 41a' to 41d' and the conductive layers 42a' to 42d' to the upper surface of the select transistor layer 30. Thus, the upper surface of the select transistor layer 30 is exposed. The trench T1 makes the interlayer insulating layers 41a' to 41d' and the conductive layers 42a' to 42d' to interlayer insulating layers 41a" to 41d" and conductive layers 42a" to 42d", respectively. The layers 41a" to 41d" and 42a" to 42d" are processed into shapes that are arranged at a predetermined pitch in the Y direction and extend in the X direction.

Figure 9:
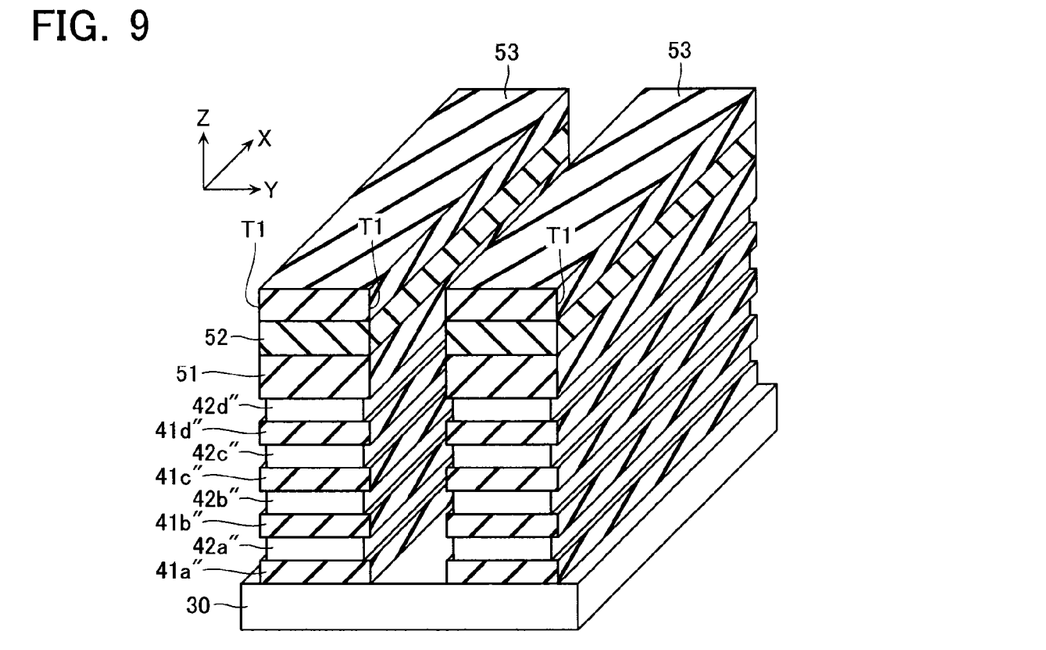
FIG. 9 is a process chart of a process for manufacturing a semiconductor memory device according to the first embodiment.

Then, with reference to FIG. 9, wet etching is performed to etch the interlayer insulating layers 41a" to 41d" and the conductive layers 42a" to 42d". If the interlayer insulating layers 41a" to 41d" are silicon oxide films and the conductive layers 42a" to 42d" are made of titanium nitride, the etchant may be mixed liquid of EDTA (Ethlenediamine tetracetic acid), ammonia water, and hydrogen peroxide ($H_2O_2$). Thus, with reference to FIG. 9, the side surfaces of the conductive layers 42a" to 42d" may be recessed from the side surfaces of the interlayer insulating layers 41a" to 41d". Note that a structure according to a second embodiment as described below may be formed using hydrogen fluoride (HF) as the etchant.

Figure 10:
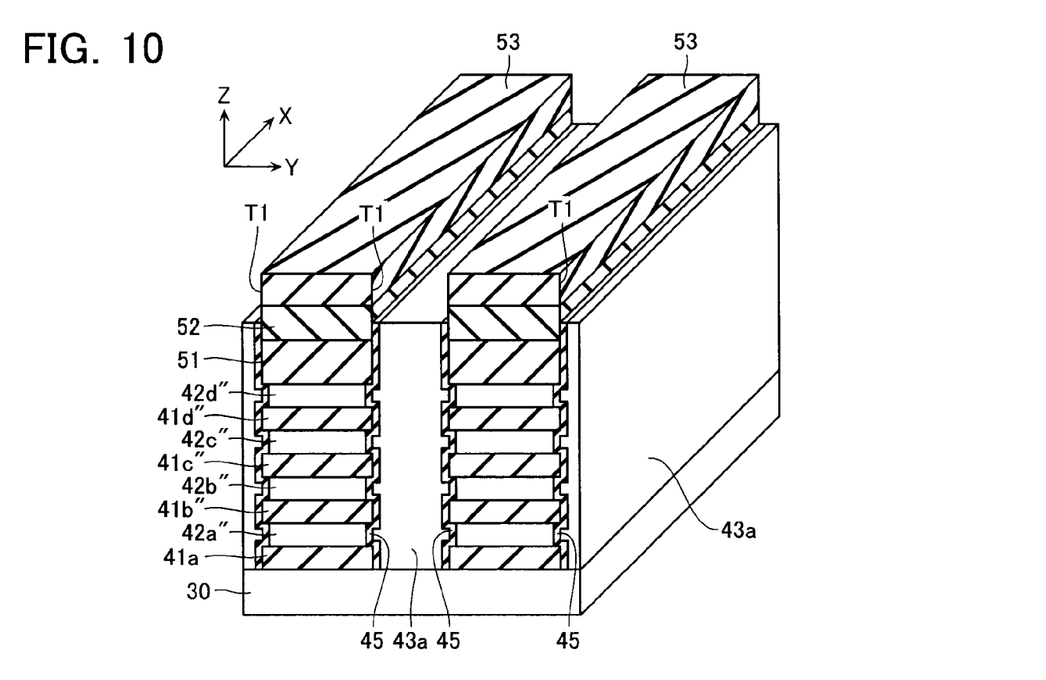
FIG. 10 is a process chart of a process for manufacturing a semiconductor memory device according to the first embodiment.

Then, with reference to FIG. 10, the variable resistance films 45 are formed continuously on the side surfaces of the interlayer insulating layers 41a" to 41d" and the conductive layers 42a" to 42d" that face the trench T1. The variable resistance films 45 are formed by a good isotropic deposition method (for example, the atomic layer deposition (ALD)). The variable resistance layers 45 are formed continuously on the side surfaces of the interlayer insulating layers 41a" to 41d" and the side surfaces of the conductive layers 42a" to 42d". The variable resistance layer 45 has convex shapes on the side surfaces of the interlayer insulating layers 41a" to 41d". Then, polysilicon (Si) is deposited to fill in the trench T1, thus forming the conductive layer 43a.

Figure 11:
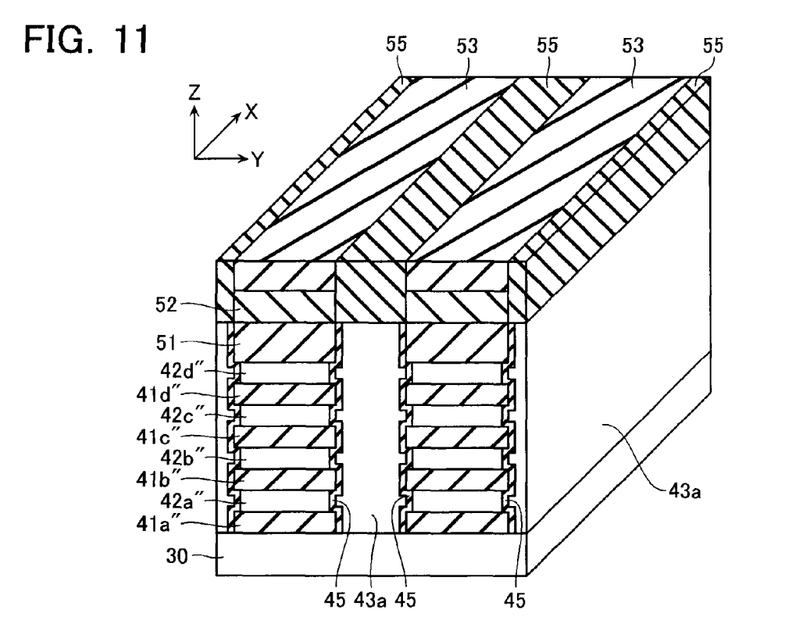
FIG. 11 is a process chart of a process for manufacturing a semiconductor memory device according to the first embodiment.

Then, with reference to FIG. 11, a silicon dioxide film 55 is deposited on the variable resistance films 45 and the conductive layer 43a. Then, the CMP (Chemical Mechanical Polishing) is used to planarize the silicon dioxide film 55 and the etching mask 53.

Figure 12:
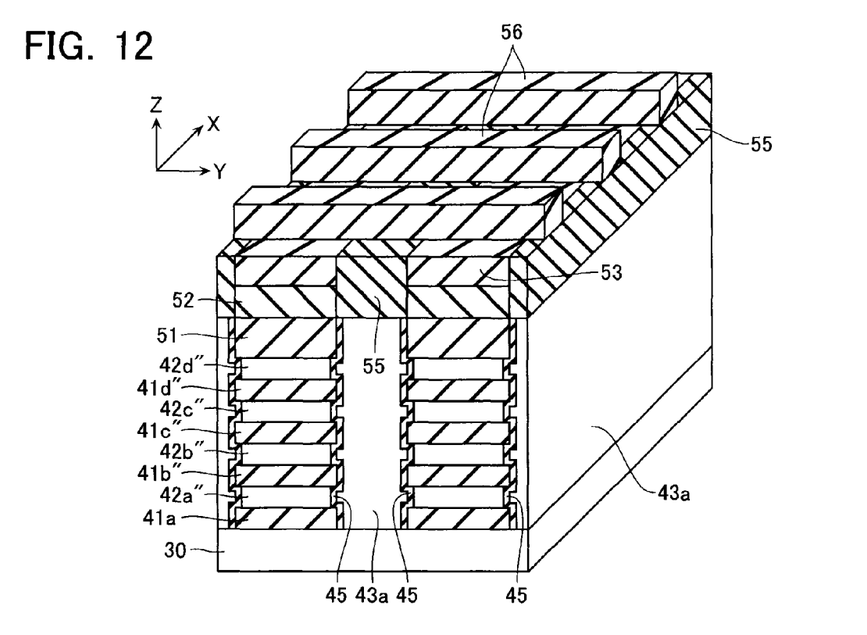
FIG. 12 is a process chart of a process for manufacturing a semiconductor memory device according to the first embodiment.

Then, with reference to FIG. 12, an additional etching mask 56 is formed on the silicon oxide film 55 and the etching mask 53. The etching mask 56 is formed including patterns that are arranged at a predetermined pitch in the X direction and extend in the Y direction as the longitudinal direction. Then, the etching masks 53 and 56 are used as masks to etch the conductive layer 43a and the variable resistance layers 45. Thus, the structures shown in FIGS. 3 to 5 are completed.

Effects

According to this embodiment, the side surfaces of the conductive layers 42a to 42d are recessed from the side surfaces of the interlayer insulating layers 41a to 41d in the direction away from the columnar conductive layers 43. In addition, the variable resistance layers 45 are formed continuously on the side surfaces of the conductive layers 42a to 42d and the side surfaces of the interlayer insulating layers 41a to 41d. Each variable resistance layer 45 has convex shapes on the side surfaces of the interlayer insulating layers 41a to 41d. Thus, the withstand voltage between the stacked memory cells may be improved. Or, compared to a semiconductor memory device having the same withstand voltage, the interlayer dielectric films may have a thinner thickness.

If the side surfaces of the conductive layers 42a to 42d are flush with the side surfaces of the interlayer insulating layers 41a to 41d (in a comparative example), the withstand voltage between the stacked memory cells depends on the film thickness of the interlayer dielectric films 41a to 41d as well as the breakdown voltage of the variable resistance layers 45. In contrast, according to this embodiment, the variable resistance layers 45 are recessed at the portions of the conductive layers 42a to 42d, and thus the withstand voltage between the memory cells depends almost only on the film thickness of the interlayer dielectric films 41a to 41d. Thus, the withstand voltage between the stacked memory cells may be improved. Or, compared to a semiconductor memory device having the same withstand voltage, the interlayer dielectric films may have a thinner thickness.

Second Embodiment

Figure 13:
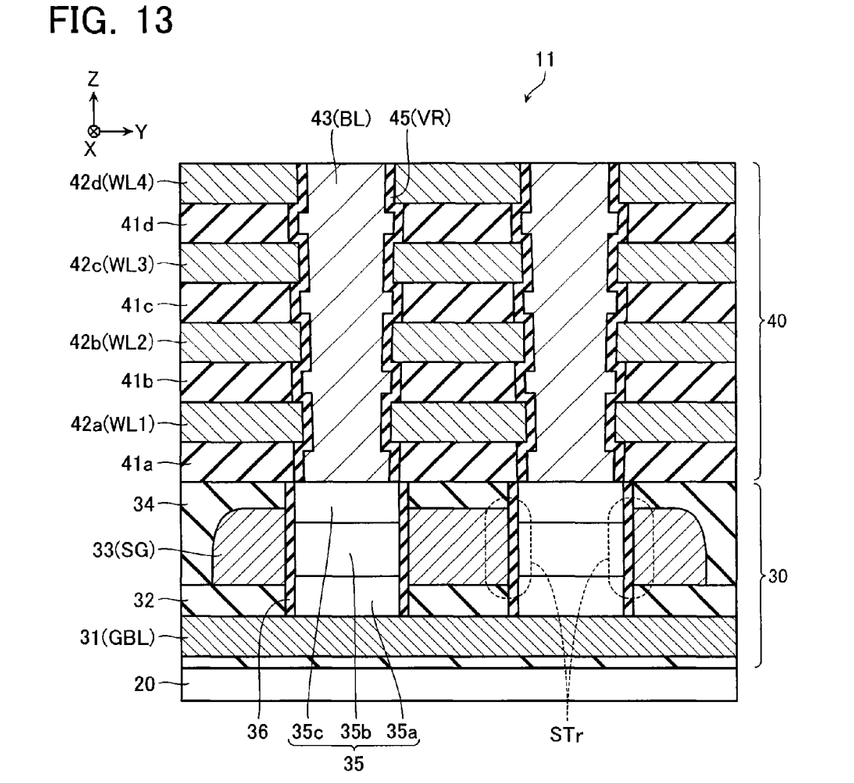
FIG. 13 is a cross-sectional view describing in more detail a structure of a memory cell array 11 according to a second embodiment.

Referring now to FIG. 13, the entire configuration of a semiconductor memory device according to a second embodiment will be described. The entire configuration and a schematic structure of the memory cell array in the second embodiment are the same as those in the first embodiment (FIGS. 1 and 2). Note, however, that the specific structure of the memory cell array in the second embodiment is different from that in the first embodiment.

FIG. 13 is a cross-sectional view of the semiconductor memory device according to the second embodiment. Unlike the first embodiment (FIG. 4) in which the side surfaces of the conductive layers 42a to 42d are recessed from the side surfaces of the interlayer insulating layers 41a to 41d, in the second embodiment, the side surfaces of the interlayer insulating layers 41a to 41d are recessed from the side surfaces of the conductive layers 42a to 42d. According to this embodiment, the conductive layers 42a to 42d as the word-lines WL each have a projected end portion at which the electric field is concentrated and by which the cell area is increased. Thus, a smaller voltage may complete the forming operation and the set operation, thereby reducing the power consumption. Note that the distance Dy between the Y-direction side surfaces of the conductive layers 42a to 42d and the Y-direction side surfaces of the interlayer dielectric films 41a to 41d is, by way of example, about 5 nm. Further, the distance Dy is preferably less than a half of the thickness Tz of the conductive layer 42a.

Third Embodiment

Figure 14:
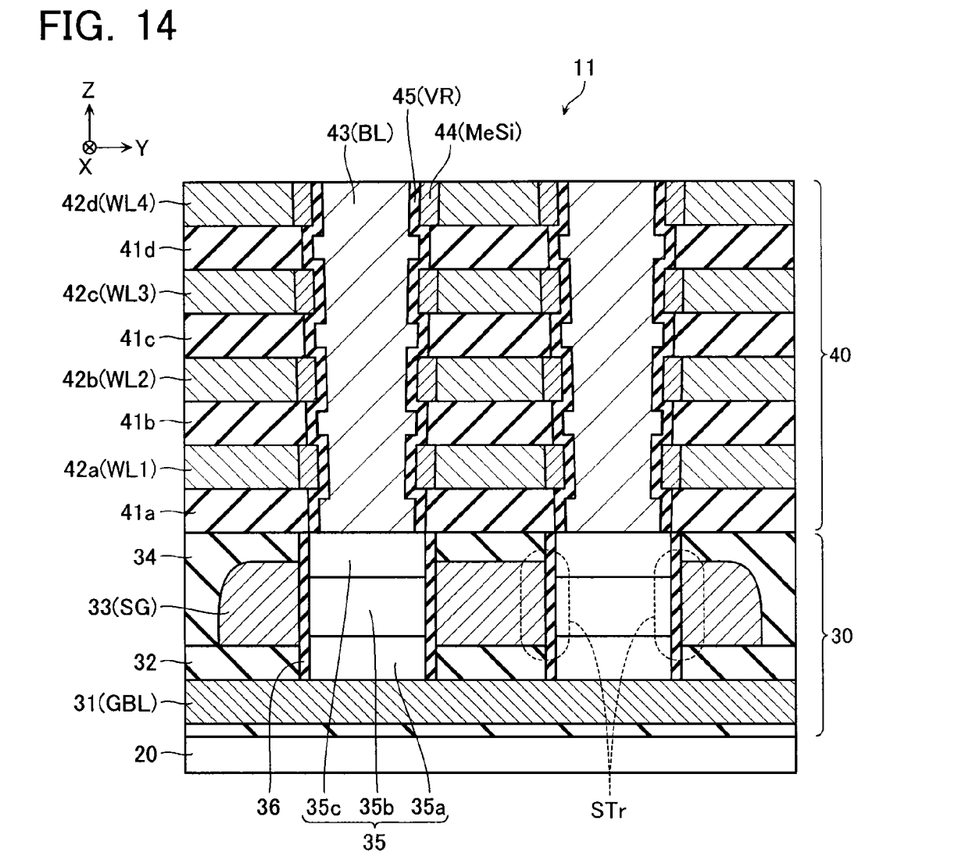
FIG. 14 is a cross-sectional view describing in more detail a structure of a memory cell array 11 according to a third embodiment.

Referring now to FIG. 14, the entire configuration of a semiconductor memory device according to a third embodiment will be described. The entire configuration and a schematic structure of the memory cell array in the third embodiment are the same as those in the first embodiment (FIGS. 1 and 2). Note, however, that the specific structure of the memory cell array in the third embodiment is different from that in the first embodiment.

FIG. 14 is a cross-sectional view of the semiconductor memory device according to the third embodiment. Unlike the first embodiment (FIG. 4) in which the side surfaces of the conductive layers 42a to 42d are recessed from the side surfaces of the interlayer insulating layers 41a to 41d, in the third embodiment, the side surfaces of the interlayer insulating layers 41a to 41d are recessed from the side surfaces of the conductive layers 42a to 42d. In addition, unlike the first embodiment, each of the conductive layers 42a to 42d in this embodiment has a silicide layer 44 formed on the side surface thereof.

Figure 15:
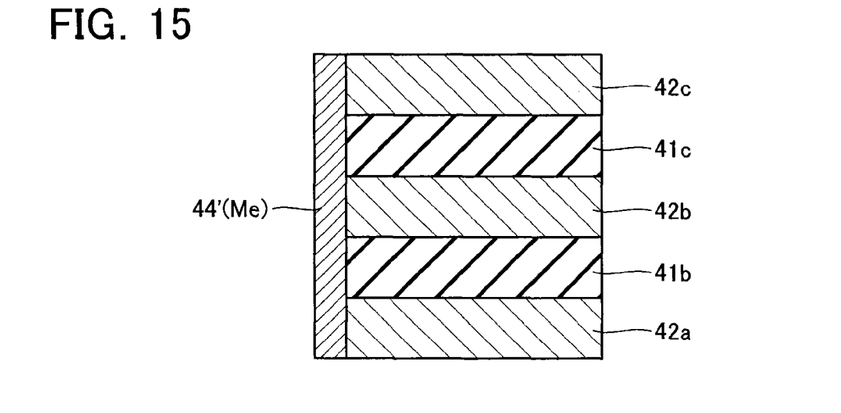
FIG. 15 is a process chart of a process for manufacturing a semiconductor memory device according to the third embodiment.
Figure 16:
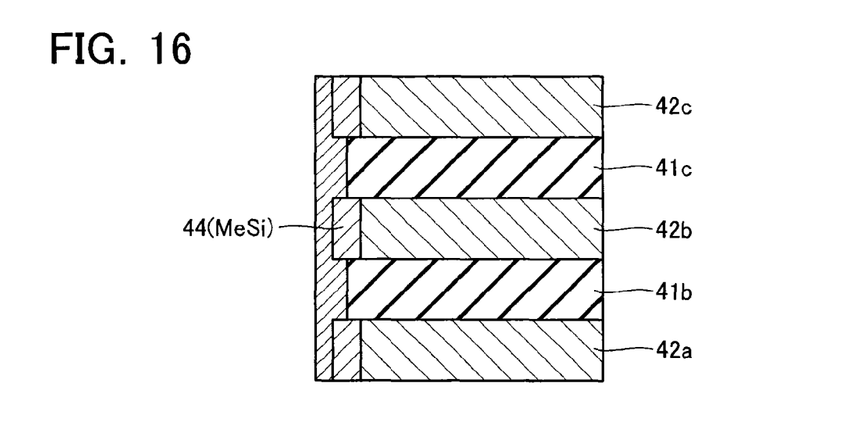
FIG. 16 is a process chart of a process for manufacturing a semiconductor memory device according to the third embodiment.
Figure 17:
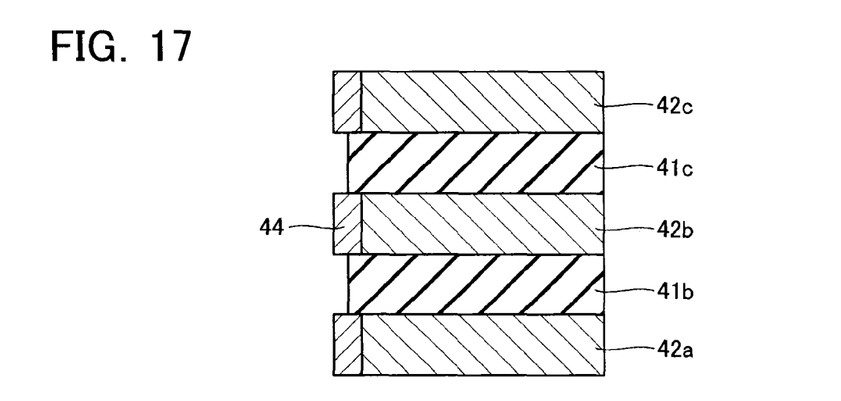
FIG. 17 is a process chart of a process for manufacturing a semiconductor memory device according to the third embodiment.

With reference to FIGS. 15 to 17, a manufacturing process according to this embodiment will be described. An example is considered here where the conductive layers 42a to 42d are made of polysilicon.

Referring first to FIG. 15, after performing the processes shown in FIGS. 6 to 8, a metal film 44' made of metal (Me) such as tungsten is formed on the side walls of the trench T1. Then, with reference to FIG. 16, a thermal process is performed to silicide the ends of the conductive layers 42a to 42d, thus forming the silicide layer 44. Then, with reference to FIG. 17, the metal film 44' is removed by wet etching. Then, the same processes in FIGS. 10 to 12 are performed to provide the structure in FIG. 14.

Note that if the conductive layers 41a to 41d are made of a metal film such as titanium nitride (TiN), a silicon film is formed instead of the metal film 44' in FIG. 15. The same structure may thus be obtained.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and spirit of the inventions.

What is claimed is:

1. A semiconductor memory device comprising a memory cell array, the memory cell array comprising a plurality of first wiring lines, a plurality of second wiring lines, the first and second wiring lines crossing each other, and a plurality of memory cells, the memory cells being disposed in crossing portions of the first and second wiring lines, each memory cell comprising a variable resistance element, the memory cell array comprising:

a plurality of first conductive layers, the first conductive layers extending in a first direction horizontal to a substrate as a longitudinal direction, and the first conductive layers being stacked in a direction perpendicular to the substrate;

an interlayer insulating layer provided between the first conductive layers;

a variable resistance layer formed continuously on side surfaces of the first conductive layers and the interlayer insulating layer; and a columnar conductive layer provided on side surfaces of the first conductive layers and the interlayer insulating layer via the variable resistance layer, the columnar conductive layer extending in a direction perpendicular to the substrate as a longitudinal direction, first side surfaces of the first conductive layers being recessed from a second side surface of the interlayer insulating layer in a direction away from the columnar conductive layer, the variable resistance layer being formed continuously on the first and second side surfaces, each variable resistance layer having a convex shape on the second side surface.

2. The semiconductor memory device according to claim 1, wherein a distance between the first side surfaces and the second side surface is less than a half of a thickness of each of the first conductive layers.

3. The semiconductor memory device according to claim 1, wherein the first side surfaces are recessed from the second side surface by about 5 nm.

4. The semiconductor memory device according to claim 1, further comprising:

a select transistor having a first end connected to one end of the second wiring line; and a third wiring line connected to a second end of the select transistor.

5. The semiconductor memory device according to claim 4, wherein a distance between the first side surfaces and the second side surface is less than a half of a thickness of each first conductive layer.

6. The semiconductor memory device according to claim 4, wherein the first side surfaces are recessed from the second side surface by about 5 nm.

7. The semiconductor memory device according to claim 4, wherein the columnar conductive layers are arranged in a matrix on the substrate, and each of the first conductive layers comprises a wiring layer of a pair of comb shapes disposed opposite in the first direction.

8. The semiconductor memory device according to claim 7, wherein a distance between the first side surfaces and the second side surface is less than a half of a thickness of each first conductive layer.

9. The semiconductor memory device according to claim 7, wherein the first side surfaces are recessed from the second side surface by about 5 nm.

10. A semiconductor memory device comprising a memory cell array, the memory cell array comprising a plurality of first wiring lines, a plurality of second wiring lines, the first and second wiring lines crossing each other, and a plurality of memory cells, the memory cells being disposed in crossing portions of the first and second wiring lines, each memory cell comprising a variable resistance element, the memory cell array comprising:

a plurality of first conductive layers, the first conductive layers extending in a first direction horizontal to a substrate as a longitudinal direction, the first conductive layers being stacked in a direction perpendicular to the substrate, and the first conductive layers functioning as the first wiring lines;

an interlayer insulating layer provided between the first conductive layers;

a variable resistance layer formed continuously on side surfaces of the first conductive layers and the interlayer insulating layer, the variable resistance layer functioning as the variable resistance element; and a columnar conductive layer provided on side surfaces of the first conductive layers and the interlayer insulating layer via the variable resistance layers, the columnar conductive layer extending in a direction perpendicular to a substrate as a longitudinal direction, and the columnar conductive layers functioning as the second wiring lines, a second side surface of the interlayer insulating layer being recessed from first side surfaces of the first conductive layers in a direction away from the columnar conductive layers, the variable resistance layer being formed continuously on the first and second side surfaces, the variable resistance layer having convex shapes on the first side surfaces.

11. The semiconductor memory device according to claim 10, wherein a distance between the first side surfaces and the second side surface is less than a half of a thickness of each first conductive layer.

12. The semiconductor memory device according to claim 10, wherein the second side surface is recessed from the first side surfaces by about 5 nm.

13. The semiconductor memory device according to claim 10, further comprising:

a select transistor having a first end connected to one end of the second wiring line; and a third wiring line connected to a second end of the select transistor.

14. The semiconductor memory device according to claim 13, wherein a distance between the first side surfaces and the second side surface is less than a half of a thickness of each first conductive layer.

15. The semiconductor memory device according to claim 13, wherein the second side surface is recessed from the first side surfaces by about 5 nm.

16. The semiconductor memory device according to claim 13, wherein the columnar conductive layers are arranged in a matrix on the substrate, and each first conductive layer comprises a wiring layer of a pair of comb shapes disposed opposite in the first direction.

17. The semiconductor memory device according to claim 16, wherein a distance between the first side surfaces and the second side surface is less than a half of a thickness of each first conductive layer.

18. The semiconductor memory device according to claim 16, wherein the first side surfaces are recessed from the second side surface by about 5 nm.

19. A method for manufacturing a semiconductor memory device, the semiconductor memory device comprising a memory cell array, the memory cell array comprising a plurality of first wiring lines, a plurality of second wiring lines, the first and second wiring lines crossing each other, and a plurality of memory cells, the memory cells being disposed in crossing portions of the first and second wiring lines, each memory cell comprising a variable resistance element, the method comprising:

alternately depositing first conductive layers for the first wiring lines and an interlayer insulating layer on a substrate, forming a trench, the trench having a shape that passes through the first conductive layers and the interlayer insulating layer and extends in a first direction horizontal to the substrate, performing wet etching on the first conductive layers and the interlayer insulating layer to recess first side surfaces of the first conductive layers from a second side surface of the interlayer insulating layer or the second side surface from the first side surfaces, and forming variable resistance layers for the variable resistance elements on the first side surfaces of the first conductive layers and the second side surface of the interlayer insulating layer and then filling in the trench with a conductive layer.

* * * * *